US011205121B2

(12) United States Patent
Mandt et al.

(10) Patent No.: US 11,205,121 B2
(45) Date of Patent: Dec. 21, 2021

(54) EFFICIENT ENCODING AND DECODING SEQUENCES USING VARIATIONAL AUTOENCODERS

(71) Applicant: DISNEY ENTERPRISES, INC., Burbank, CA (US)

(72) Inventors: Stephan Marcel Mandt, Santa Monica, CA (US); Yingzhen Li, Burbank, CA (US)

(73) Assignee: Disney Enterprises, Inc., Burbank, CA (US)

( * ) Notice: Subject to any disclaimer, the term of this patent is extended or adjusted under 35 U.S.C. 154(b) by 844 days.

(21) Appl. No.: 16/013,857

(22) Filed: Jun. 20, 2018

(65) Prior Publication Data
US 2019/0392302 A1    Dec. 26, 2019

(51) Int. Cl.
| | |
|---|---|
| *H03M 7/00* | (2006.01) |
| *G06N 3/08* | (2006.01) |
| *H03M 13/00* | (2006.01) |
| *G10L 19/04* | (2013.01) |
| *H03M 7/30* | (2006.01) |
| *H03M 1/00* | (2006.01) |

(52) U.S. Cl.
CPC .............. *G06N 3/08* (2013.01); *G10L 19/04* (2013.01); *H03M 1/00* (2013.01); *H03M 7/00* (2013.01); *H03M 7/30* (2013.01); *H03M 13/6502* (2013.01)

(58) Field of Classification Search
USPC .................................................... 341/50, 51
See application file for complete search history.

(56) References Cited

U.S. PATENT DOCUMENTS

| | | | |
|---|---|---|---|
| 10,181,098 B2* | 1/2019 | Vinyals | G06F 40/40 |
| 10,452,978 B2* | 10/2019 | Shazeer | G06N 3/0454 |
| 10,719,764 B2* | 7/2020 | Shazeer | G06N 3/04 |

(Continued)

OTHER PUBLICATIONS

Chung et al., "A Recurrent Latent Variable Model for Sequential Data". In Advances in neural information processing systems, 28th International Conference on Neural Information Processing Systems (NIPS'15), vol. 2, 9 pages, 2015.

(Continued)

*Primary Examiner* — Jean B Jeanglaude
(74) *Attorney, Agent, or Firm* — Artegis Law Group, LLP

(57) ABSTRACT

Embodiments include applying neural network technologies to encoding/decoding technologies by training and encoder model and a decoder model using a neural network. Neural network training is used to tune a neural network parameter for the encoder model and a neural network parameter for the decoder model that approximates an objective function. The common objective function may specify a minimized reconstruction error to be achieved by the encoder model and the decoder model when reconstructing (encoding then decoding) training data. The common objective function also specifies for the encoder and decoder models, a variable f representing static aspects of the training data and a set of variables z1:T representing dynamic aspects of the training data. During runtime, the trained encoder and decoder models are implemented by encoder and decoder machines to encode and decoder runtime sequences having a higher compression rate and a lower reconstruction error than in prior approaches.

20 Claims, 6 Drawing Sheets

(56) References Cited

U.S. PATENT DOCUMENTS

| | | | | |
|---|---|---|---|---|
| 10,733,390 | B2* | 8/2020 | Kalchbrenner | G06N 3/0472 |
| 10,817,650 | B2* | 10/2020 | McCann | G06N 3/0445 |
| 10,930,269 | B2* | 2/2021 | Guevara | G06N 3/08 |

OTHER PUBLICATIONS

Denton et al., "Unsupervised Learning of Disentangled Representations from Video". arXiv preprint arXiv:1705.10915v1, 13 pages, May 31, 2017.
Fabius et al. "Variational Recurrent Auto-Encoders". arXiv preprint arXiv:1412.6581v6, 5 pages, submitted 2014, revised Jun. 15, 2015.
Fraccaro et al., "Sequential Neural Models with Stochastic Layers". In Advances in neural information processing systems, 30th Conference on Neural Information Processing Systems (NIPS 2016), 9 pages, 2016.
Hsu et al., "Unsupervised Learning of Disentangled and Interpretable Representations from Sequential Data". In Advances in neural information processing systems, 31st Conference on Neural Information Processing Systems (NIPS 2017), 12 pages, 2017.
Karl e al., "Deep Variational Bayes Filters: Unsupervised Learning of State Space Models from Raw Data". arXiv preprint arXiv:1605.06432v1, 12 pages, May 20, 2016.
Krishnan et al., "Deep Kalman Filters". arXiv preprint arXiv:1511.05121v2, 17 pages, Nov. 25, 2015.
Toderici et al., "Full Resolution Image Compression with Recurrent Neural Networks". arXiv:1608.05148v2, https://arxiv.org/abs/1608.05148, 9 pages, Jul. 7, 2017.
Gregor et al., "Towards Conceptual Compression". arXiv:1604.08772v1, https://arxiv.org/pdf/1604.08772.pdf, 14, pages, Apr. 29, 2016.
Mentzer et al., "Conditional Probability Models for Deep Image Compression". arXiv:1801.04260v1, https://arxiv.org/pdf/1801.04260v1.pdf, 18 pages, Jan. 12, 2018.
Agustsson et al., "Generative Adversarial Networks for Extreme Learned Image Compression". arXiv:1804.02958v1, https://arxiv.org/pdf/1804.02958v1.pdf, 27 pages, Apr. 9, 2018.
Bayer et al., "Learning Stochastic Recurrent Networks". arXiv preprint arXiv:1411.7610v1, 7 pages, Nov. 27, 2014.
Bouchacourt et al., "Multi-level Variational Autoencoder: Learning Disentangled Representations from Grouped Observations". arXiv preprint arXiv:1705.08841, 2017.
Chen et al., "Interpretable Representation Learning by Information Maximizing Generative Adversarial Nets". In Advances in Neural Information Processing Systems, 9 pages, 2016.
Dehak et al., "Support Vector Machines Versus Fast Scoring in the Low-dimensional Total Variability Space for Speaker Verification" In Tenth Annual conference of the international speech communication association, 2009.
Dehak et al., "Front-end Factor Analysis for Speaker Verification". IEEE Transactions on Audio, Speech, and Language Processing, 19(4):788-798, May 4, 2011.
Deng et al., "Factorized Variational Autoencoders for Modeling Audience Reactions to Movies". In Computer Vision and Pattern Recognition (CVPR), 2017 IEEE Conference on, 10 pages IEEE, 2017.
Fraccaro et al., "A Disentangled Recognition and Nonlinear Dynamics Model for Unsupervised Learning. In Advances in Neural Information Processing Systems", 10 pages, 2017.
Garofolo et al., TIMIT "Acoustic-Phonetic Continuous Speech Corpus", LDC93S1. Web Download. Philadelphia: Linguistic Data Consortium, 91 pages, 1993.
Goodfellow et al., "Generative Adversarial Nets. In Advances in Neural Information Processing Systems", 9 pages, Jun. 10, 2014.
Graves, et al., "Framewise Phoneme Classification with Bidirectional LSTM and Other Neural Network Architectures", Neural Networks, 8 pages, 2005.
Giffin et al., "Signal Estimation from Modified Short-time Fourier Transform". IEEE Transactions on Acoustics, Speech, and Signal Processing, 32(2): pp. 236-243, 1984.
Higgins et al., "Early Visual Concept Learning with Unsupervised Deep Learning" DISN. arXiv preprint arXiv:1606 05579, 12 pages, Sep. 20, 2016.
Hochreiter et al., "Long Short-term Memory". Neural computation, 9(8): 32 pages, 1997.
Johnson et al., "Composing Graphical Models with Neural Networks for Structured Representations and Fast Inference" In Advances in neural information processing systems, 9 pages, 2016.
Jordan et al., "An Introduction to Variational Methods for Graphical Models". Machine learning, 37(2):183-233, 1999.
Kingma et al., "Auto-encoding Variational Bayes". arXiv preprint arXiv:1312.6114v10, 14 pages, May 1, 2014.
Krishnan et al., "Structured Inference Networks for Nonlinear State Space Models". 2017.
Mathieu et al., "Disentangling Factors of Variation in Deep Representations Using Adversarial Training". In Advances in Neural Information Processing Systems, 9 pages, 2016.
Reed et al., "Deep Visual Analogy-Making". In Advances in neural information processing systems, 9 pages, 2015.
Rezende et al., "Stochastic Backpropagation and Approximate Inference in Deep Generative Models". arXiv preprint arXiv:1401.4082, 14 pages, May 30, 2014.
Siddharth et al., "Learning Disentangled Representations with Semi-supervised Deep Generative Models". arXiv preprint arXiv:1706.00400v2, pp. 11, Nov. 13, 2017.
Villegas et al., "Decomposing Motion and Content for Natural Video Sequence Prediction". In ICLR, 22 pages, Jun. 25, 2017.
Vondrick et al., "A. Generating Videos with Scene Dynamics". In Advances In Neural Information Processing Systems, 10 pages, 2016.

* cited by examiner

EFFICIENT ENCODING AND DECODING SEQUENCES USING VARIATIONAL AUTOENCODERS

BACKGROUND

Field of the Various Embodiments

Embodiments of the present invention generally relate to computer science and, more specifically, to efficient encoding and decoding sequences using variational autoencoders.

Description of the Related Art

Codecs (COmpressor-DECompressor) are compression algorithms designed to encode/compress and decode/decompress source data (input sequences) to reduce the size of the source data. Many popular codecs produce lossy compression that reduces the data size of the source data by removing unnecessary or less important information of the source data. Such lossy codecs encode source data using inexact approximations and the partial discarding of the source data, but allows for a large reduction in data size when compared to uncompressed data or lossless compression. Lossy compression is commonly used to encode multimedia data sequences, such as audio or video, in a wide range of applications, such as playback from local storage and remote streaming over a network. Compression is highly useful as it reduces the data size of the source data, which significantly reduces the storage resources required to store the source data. Also, if the source data is to be transmitted over a network, compression allows for faster transmission of the source data and/or reduces the bit-rate and bandwidth requirements for transmitting the source data. A decoder algorithm is then used to decode/decompress the encoded/compressed data to reverse the encoding process for playback of the source data (such as multimedia data sequences).

Conventional compression techniques for video sequences commonly apply a discrete cosine transform (DCT) for spatial redundancy reduction, along with audio compression techniques in parallel to compress the corresponding audio sequence. Typical compression techniques for audio sequences use perceptual or psychoacoustic techniques and frequency analysis to reduce (or approximate) the accuracy of certain components of sound frequencies that are beyond the hearing capabilities of most humans. To determine what information in an audio signal is perceptually irrelevant, a modified discrete cosine transform (MDCT) may be used to convert time domain sampled waveforms into a frequency domain, whereby component frequencies can be allocated bits according to how audible the component frequencies are.

A drawback of conventional compression techniques, however, is that such techniques typically have difficulty providing high compression rates/ratios while also generating high quality reconstructed sequences. More specifically, the compression rate/ratio indicates the data size of the uncompressed input sequence compared to the data size of the compressed encoded sequence. A higher compression rate/ratio generates a smaller compressed data source, which is desirable and results in greater storage savings and less network bandwidth requirements when transmitting compared to a lower compression rate/ratio. The compression rate/ratio is determined by the encoder algorithm that encodes the input sequence to produce an encoded sequence. A corresponding decoder algorithm then decompresses/decodes the encoded sequence to generate a decoded sequence (reconstructed sequence). An amount of reconstruction error can be determined by the error (difference) between the decoded/reconstructed sequence and the original input sequence. A compression technique having a lower reconstruction error provides reconstructed sequences of higher quality that are more similar to the input sequences than a compression technique having a higher reconstruction error. Given that the reconstruction process includes the encoding and decoding of the input sequences, the amount of reconstruction error is determined by both the encoder algorithm and the corresponding decoder algorithm.

As discussed above, a compression technique providing a relatively higher compression rate typically provides a relatively lower reconstruction quality (higher reconstruction error). Likewise, a compression technique providing a relatively higher reconstruction quality typically provides a relatively compression rate. Thus, as noted above, with lossy compression, there is a trade-off between high compression rates and high reconstruction quality. A further drawback of conventional compression techniques is that conventional compression techniques have seemingly reached a limit with respect to increasing the compression rates and/or increasing the reconstruction quality of the input sequences. Notably, however, increasing the compression rates and/or increasing the reconstruction quality beyond conventional compression techniques is highly desirable as this would further conserve storage and network bandwidth resources and/or increase the reconstruction quality of the input sequences.

As the foregoing illustrates, what is needed in the art are more effective approaches for encoding and decoding data sequences.

SUMMARY

Various embodiments described herein include a computer-implemented method for encoding an input sequence. The method includes receiving, at an encoder engine implementing an encoder model, the input sequence. The method further includes compressing the input sequence implementing the encoder model for generating an encoded sequence, wherein the encoder model is generated through neural network training to encode static aspects of the input sequence that are consistent or substantially consistent throughout an entirety of the input sequence.

Various embodiments described herein include a computer-implemented method for decoding an encoded sequence. The method includes receiving, at a decoder engine implementing a decoder model, the encoded sequence. The method further includes decompressing the encoded sequence implementing the decoder model for generating a decoded sequence, wherein the decoder model is generated through neural network training to decode static aspects of the encoded sequence that are consistent or substantially consistent throughout an entirety of the encoded sequence.

At least one technological improvement of the disclosed techniques relative to prior art is that implementing an encoder model generated via neural network training to compress an input sequence can provide higher compression ratios than achieved by conventional compression techniques. In particular, the disclosed techniques leverage the machine learning ability of neural networks to approximate any function, such as encoder and decoder functions, to train an encoder model to achieve higher compression ratios compared to conventional compression techniques.

At least one other technological improvement of the disclosed techniques relative to prior art is that compressing an input sequence by implementing an encoder model generated via neural network training for identifying and encoding at least one static aspect of the input sequence can provide a further increase in compression ratios than achieved by conventional compression techniques and/or an encoder model generated via neural network training that does not identify and encode static aspects of the input sequence. In particular, implementing an encoder model generated via neural network training that identifies a static aspect of the input sequence allows a single instance of the static aspect to be encoded for the entire input sequence, which allows for higher compression ratios than achieved by an encoder model that does not identify and encode/decode static aspects of the input sequence.

At least one other technological improvement of the disclosed techniques relative to prior art is that implementing an encoder model and decoder model each generated via neural network training to reconstruct (encode and decode) an input sequence can provide higher compression ratios and/or higher reconstruction quality than achieved by conventional compression techniques. In particular, the disclosed techniques leverage the machine learning ability of neural networks to approximate any function, such as encoder and decoder functions, to train an encoder model and decoder to achieve higher compression ratios and/or higher reconstruction quality (lower reconstruction error) compared to conventional compression techniques.

At least one other technological improvement of the disclosed techniques relative to prior art is that reconstructing (encoding and decoding) an input sequence an input sequence by implementing an encoder model and decoder model each generated via neural network training for identifying and encoding/decoding at least one static aspect of the input sequence can provide a further increase in compression ratios and reconstruction quality than achieved by conventional compression techniques and/or an encoder model and decoder model generated via neural network training that does not identify and encode/decode static aspects of the input sequence. In particular, implementing an encoder model and a decoder model each generated via neural network training that identifies a static aspect of the input sequence allows a single instance of the static aspect to be encoded and decoded for the entire input sequence, which allows for even higher compression ratios and higher reconstruction quality than achieved by an encoder model and a decoder model that does not identify and encode/decode static aspects of the input sequence.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

Figure 1:
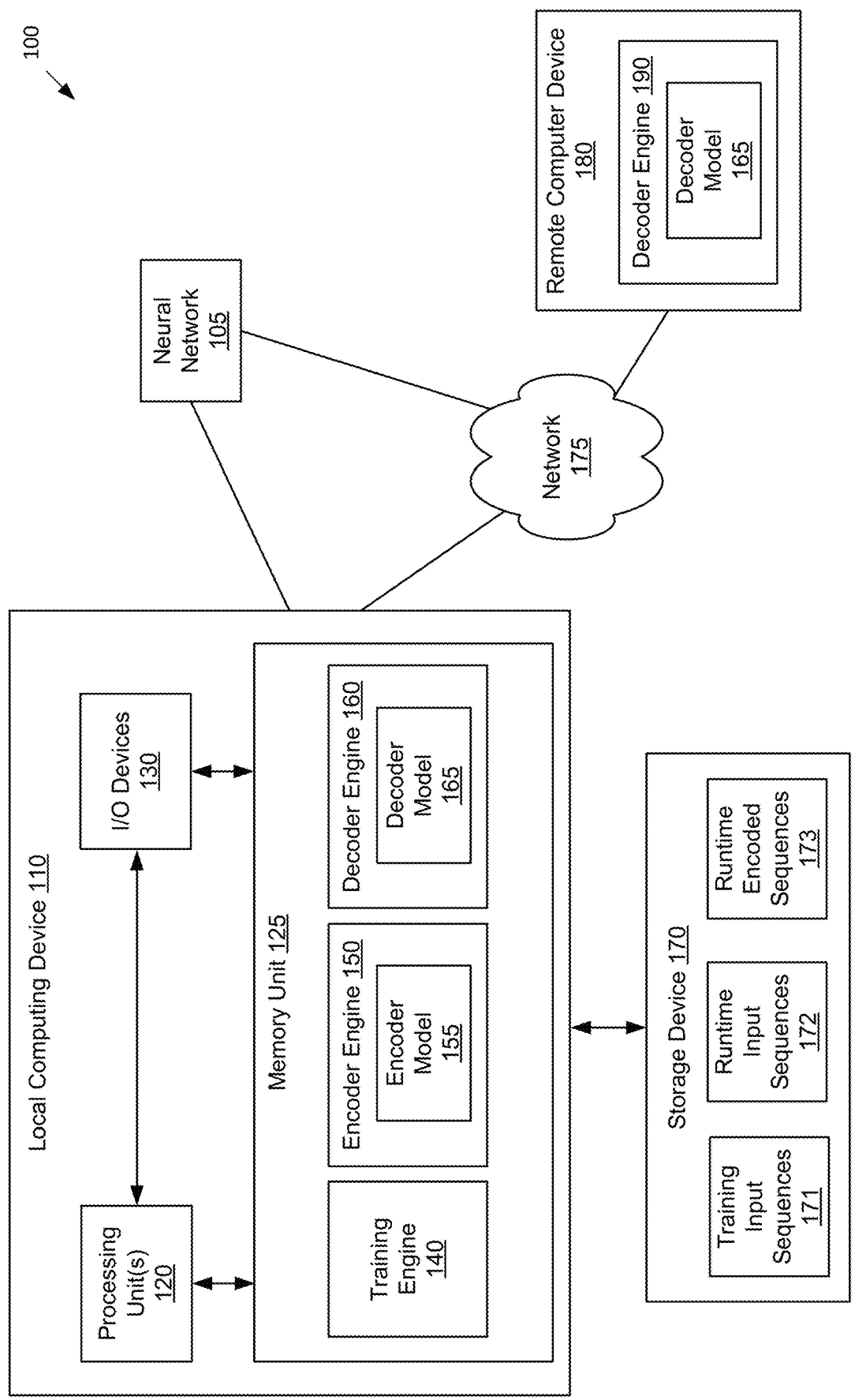
FIG. 1 illustrates a computer environment configured to implement one or more aspects of the present invention.

In the following description, numerous specific details are set forth to provide a more thorough understanding of the various embodiments. However, it will be apparent to one of skilled in the art that the inventive concepts may be practiced without one or more of these specific details.

Embodiments described herein include apply neural network technologies to encoding/decoding technologies to further develop encoding/decoding techniques. In particular, embodiments described herein include compression techniques for encoding/decoding data sequences using an encoder model and a decoder model that are each generated and trained using a neural network. In this regard, the publication by Yingzhen Li and Stephan Mandt having the title, "Disentangled Sequential Autoencoder," arXiv: 1803.02991 (2018), is hereby incorporated herein by reference.

A neural network, or an artificial neural network, is known as a form of machine learning that implements a parallel distributed processing network modeled after cortical structures of the brain. A neural network includes a computing system made up of a large number of highly interconnected nodes (hardware and software processing elements) that work in conjunction to "learn" (determine) complex structures and relationships from received training data (input data). A neural network implements a form of machine learning by executing a neural network algorithm that uses statistical techniques to build a model that achieves a specific objective function using training data (input data), without the model being explicitly programmed to achieve the specific objective function. The model may be trained by the neural network to approximate any arbitrary function, as defined by the objective function, by considering the examples of the training data, without any task-specific programming. Neural network training may be used to "parameterize" a model based on the objective function, which includes determining an optimized neural network parameter for the model that enables the model to achieve the best (or closest) approximation of the objective function based on the training data. Neural network training may be used to iteratively and progressively tune the neural network parameter of the model based on a large amount of training examples to determine the optimized neural network parameter.

In the embodiments described herein, during a training phase, neural network training is used to generate an encoder model and a decoder model using training input data. The training input data received by a neural network comprises a plurality of training input sequences, each training input sequence comprising an ordered sequence of segments. Each segment may comprise a discrete set of data associated with a particular order number in the ordered sequence. For example, for video encoding/decoding, the training input data may comprise a plurality of frame sequences, each frame sequence comprising a time-ordered sequence of video frames, each video frame comprising an image associated with a particular time point in the time-ordered sequence. As another example, for audio encoding/decoding, the training input data may comprise a plurality of audio sequences, each audio sequence comprising a time-ordered sequence of audio samples, each audio sample comprising a frequency sample associated with a particular time point in the time-ordered sequence. During a later runtime phase, the encoder model and decoder model may be used to encode/decode new runtime input data that is different from the training input data. The runtime input data may likewise comprise an ordered sequence of data segments, such as a time-ordered sequence of video frames or a time-ordered sequence of audio samples. In the embodiments discussed below, the training input data and the runtime input data are described as sequences of video frames for illustrative purposes only. In other embodiments, however, the training input data and the runtime input data may comprise any ordered sequence of discrete data segments, such as a sequence of audio samples for audio encoding/decoding.

During the training phase, neural network training is used to generate an encoder model and a decoder model that, in conjunction, approximates a common objective function using training input data. In particular, neural network training is used to determine/tune an optimized neural network parameter phi ($\phi$) for the encoder model and an optimized neural network parameter theta ($\theta$) for the decoder model that, in conjunction, best approximates the common objective function. In some embodiments, the common objective function may specify a minimized reconstruction error to be achieved by the encoder model and the decoder model when reconstructing (encoding then decoding) the training data. Thus, the common objective function may also be viewed as specifying a maximized reconstruction quality to be achieved by the encoder model and the decoder model when reconstructing (encoding then decoding) the training data. By using a neural network to train the encoder model and the decoder model to minimize reconstruction error when reconstructing training input data, an optimized encoder model and optimized decoder model may be generated and used in runtime that reduces reconstruction error of runtime input data compared to conventional compression techniques.

In further embodiments, the common objective function specifies, for both the encoder model and the decoder model, a variable f representing static aspects of the training input data and a set of variables $z1:T$ generally representing dynamic aspects of the training input data. The variable f and the set of variables $z1:T$ comprise separate and distinct variables used to encode and decode separate and distinct aspects of the training input data. In particular, for training input data comprising a particular time-ordered sequence of frames $x1:T$ of length T (i.e., frames $x1 \ldots xT$), the variable f is used by the neural network and encoder/decoder models to identify and encode/decode static aspects of the sequence that are common (consistent) across/throughout all frames of the sequence ($x1 \ldots xT$). The set of variables $z1:T$ comprises a set of ordered variables of length T (i.e., $z1 \ldots zT$) that each represent the dynamic aspects of a corresponding frame in the sequence of frames $x1:T$ (i.e., frames $x1 \ldots xT$). For example, the variable $z1$ may be used by the neural network and encoder/decoder models to identify and encode/decode aspects of corresponding frame $x1$ that are unique to frame $x1$ across/throughout the entire sequence of frames $x1:T$. For example, the variable $z2$ may be used by the neural network and encoder/decoder models to identify and encode/decode aspects of corresponding frame $x2$ that are unique to frame $x2$ across/throughout the entire sequence of frames $x1:T$. For example, the variable $z3$ may be used by the neural network and encoder/decoder models to identify and encode/decode aspects of corresponding frame $x3$ that are unique to frame $x3$ across/throughout the entire sequence of frames $x1:T$, and so forth.

By identifying and separately encoding the static and dynamic aspects of a sequence of frames using the neural network, the encoder model is trained to encode a single instance of the identified static aspects for the entire sequence of frames, rather than a separate instance for each frame in the sequence. Thus, during runtime when receiving a new sequence of frames, the encoder model is used to encode a single instance of the static aspects for the entire new sequence of frames. Encoding a single instance of the static aspects increases the compression ratio and storage savings compared to the compression ratio and storage savings achieved by conventional compression techniques and/or an encoder model generated via neural network training that does not identify and encode static aspects of the input sequence.

As described above, the training phase generates an encoder model and a decoder model using training input sequences. During a later runtime phase, the encoder/decoder models are able to receive new runtime input sequences that are different from the training input sequences, and still compress the runtime input sequences with high compression ratios while reconstructing the runtime input sequences with low reconstruction error compared to conventional approaches. The encoder model may be implemented in an encoder machine that receives and encodes/compresses a runtime input sequence to produce an encoded sequence. The ratio of the original data size of the runtime input sequence to the reduced data size of the encoded sequence indicates the compression ratio achieved by the encoder model. The decoder model may be implemented in a decoder machine that receives and decodes/decompresses the encoded sequence to produce a decompressed sequence. The decompressed sequence comprises the reconstructed sequence of the runtime input sequence. The amount of error or difference between the runtime input sequence and the decompressed/reconstructed sequence indicates the amount of reconstruction error produced by the encoder model and decoder model.

The following description is divided into three sections. Section I describes an computer environment for encoding and decoding data sequences using encoder and decoder models. Section II describes a training phase for neural network training of the encoder and decoder models using training input sequences. Section III describes a runtime phase for encoding and decoding runtime input sequences using the trained encoder and decoder models.

Section I: Encoding and Decoding Environment

FIG. 1 illustrates a computer environment 100 configured to implement one or more aspects of the present invention. The computer environment 100 may comprise an environment for encoding and decoding data sequences using encoder and decoder models. As shown, the environment 100 includes, without limitation, a neural network 105, local computing device 110, and a remote computing device 180 that are coupled together via a network 175. The network 120 may comprise any technically feasible communications or information network, wired or wireless, that allows data exchange, such as a wireless (Wi-Fi) network, personal area network (such as Bluetooth, Wireless USB, IrDA, etc.), wide area network (WAN), a local area network (LAN), and/or the Internet, among others.

Local computing device 110 may be a server system, client system, workstation, a laptop computer, a tablet or hand-held device, or any other type of computing device. As shown in FIG. 1, the local computing device 110 may be directly connected to the neural network 105 or connected to the neural network 105 via the network 175. Local computing device 110 includes one or more processing units 120 coupled to input/output (I/O) devices 130 and to memory unit 125. Processing unit(s) 120 may be a central processing unit (CPU), a graphics processing unit (GPU), or a combination of different processing units, such as a CPU configured to operate in conjunction with a GPU. In general, processing unit 120 may be any technically feasible hardware unit capable of processing data and/or executing software applications. I/O devices 130 are also coupled to memory unit 125 and include input devices capable of receiving user input, output devices capable of generating output, as well as network devices capable of communicating via a network (not shown). Examples of input devices include a keyboard, a mouse, a touchscreen, a microphone, or other input elements. Examples of output devices include a monitor display, audio speakers/headphones, a printer, or other output elements. The I/O devices 130 may further include a network card comprising a network interface controller (NIC), network adapter, or similar computer hardware component that connects the local computing device 110 to the network 175. The input and output devices allow an end-user access to the environment 100. Memory unit 125 includes a training engine 140, an encoder engine 150 implementing an encoder model 155, and a decoder engine 160 implementing a decoder model 165. Local computing device 110 is coupled to a storage device 170 that stores training input sequences 171, runtime input sequences 172, and runtime encoded sequences 173.

In some embodiments, the training engine 140 interacts with the neural network 105 to train and generate the encoder model 155 and decoder model 165 using a plurality of training input sequences 171. The training input sequences 171 may include a wide variety of different sequences, such as a wide variety of video clips or audio clips. The neural network 105 may represent a parallel distributed processing network comprising a computing system made up of a large number of highly interconnected nodes (hardware and software processing elements). The interconnected nodes of the neural network 105 work in conjunction to "learn" (determine) complex structures and relationships from the received training input sequences 171. The training engine 140 and neural network 105 may interact and work in conjunction to train and optimize the encoder model 155 and the decoder model 165 by determining optimal neural network parameters for the encoder model 155 and the decoder model 165 using the training input sequences 171. As used herein, an "optimized" model may indicate a model that is trained, determined, tuned, and/or improved using neural network training. As used herein, "optimized" or "optimal" neural network parameters may indicate neural network parameters that are trained, determined, tuned, and/or improved using neural network training.

After the training phase during runtime, the encoder engine 150 may implement the trained and optimized encoder model 155 to receive and compress runtime input sequences 172 to produce runtime encoded sequences 173. Also during runtime, the decoder engine 160 may then implement the trained and optimized decoder model 165 to receive and decompress the runtime encoded sequences 173 to produce runtime decoded sequences (reconstructed sequences) that are played back/presented via the I/O devices 130. The decoder engine 160 and/or I/O devices 130 may include any further components needed present the runtime encoded sequences 173 on the I/O devices 130, such as a digital-to-analog converter (DAC) and other required components. For example, for video sequences, the runtime decoded sequences may be played back on a display monitor and audio speaker. For example, for audio sequences, the runtime decoded sequences may be played back on an audio speaker.

The runtime encoded sequences 173 comprise compressed versions of the runtime input sequences 172 with a significantly reduced data size for each runtime input sequence 172. Thus, when stored to a local storage device 170, the runtime encoded sequences 173 achieves substantial storage savings compared to storing the uncompressed runtime input sequences 172 in the local storage device 170 or compressed runtime input sequences that are compressed using conventional techniques. Further, transmitting at least one runtime encoded sequence 173 to a remote computer device 180 via the network 175 will significantly reduce the bit-rate, network bandwidth requirements, and/or transmission time required compared to transmitting the corresponding uncompressed runtime input sequence 172 or compressed runtime input sequences that are compressed using conventional techniques to the remote computer device 180 via the network 175.

Similar to the local computing device 110, the remote computer device 180 also comprise any other type of computing device, such as a client system, a laptop computer, a tablet or hand-held device, or a user playback device. Similar to the local computing device 110, the remote computer device 180 may also include one or more processing units coupled to I/O devices and a memory unit. The I/O devices may include a monitor display or audio speakers for presenting decoded sequences and a network card for connecting the remote computer device 180 to the network 175. The memory unit of the remote computer device 180 may include a decoder engine 190 implementing the decoder model 165 trained by the training engine 140 and the neural network 105. During runtime, the remote computer device 180 may receive at least one runtime encoded sequence 173 from the local computer device 110 via the network 175. The decoder engine 190 of the remote computer device 180 may then implement the decoder model 165 to decompress the runtime encoded sequence 173 to produce a runtime decoded sequence (reconstructed sequence) that is presented via the I/O devices of the remote computer device 180.

Section II: Training Phase

Figure 2:
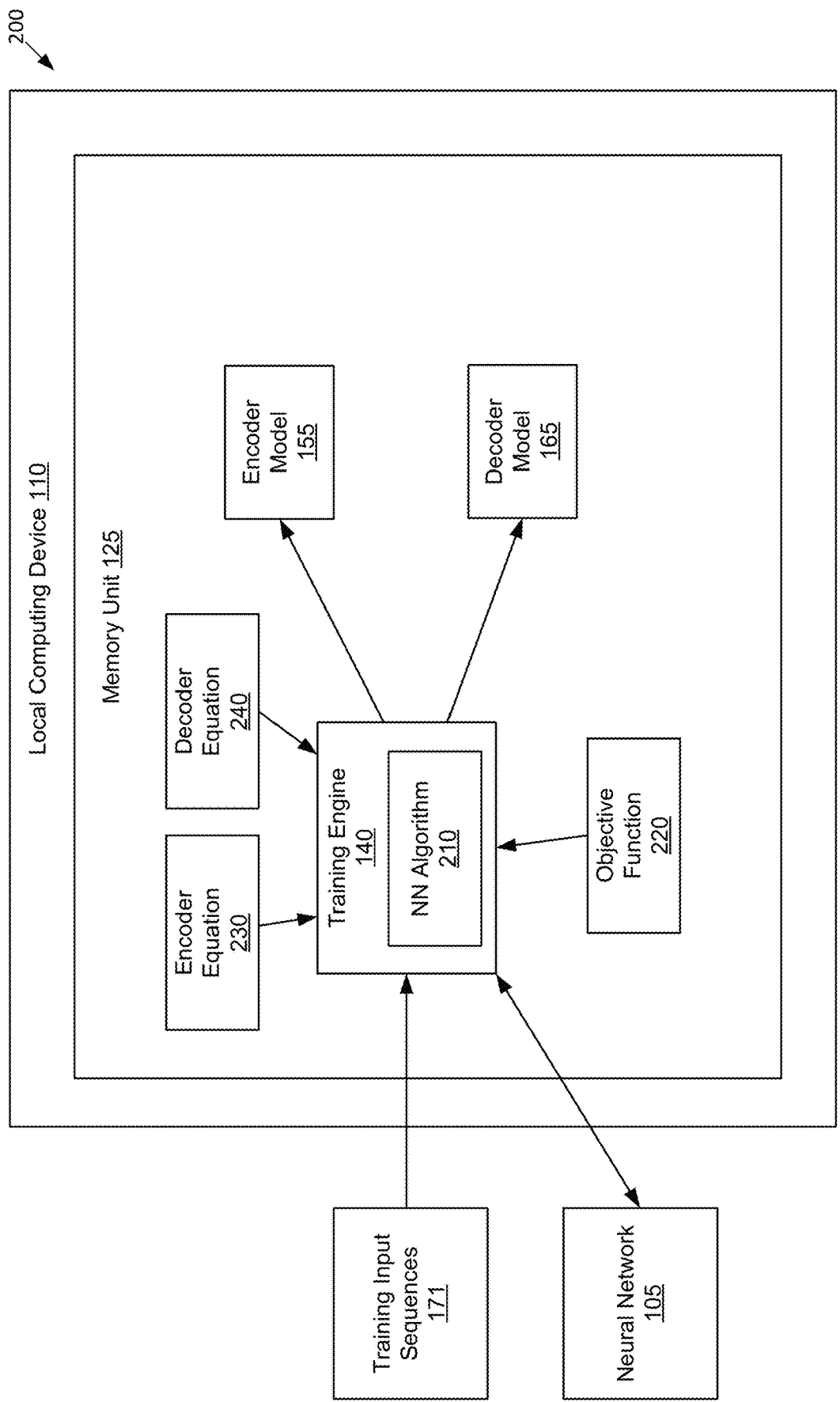
FIG. 2 illustrates a training system that is implemented in the local computing device of FIG. 1, according to various embodiments of the present invention.

FIG. 2 illustrates a training system 200 that is implemented in the local computing device of FIG. 1, according to various embodiments of the present invention. The training system 200 may comprise a computing system for neural network training of encoder and decoder models using training input sequences.

As shown, the training system 200 includes, without limitation, a neural network 105 coupled to a local computing device 110. Local computing device 110 comprises a memory unit 125 that includes a training engine 140 that executes a neural network algorithm 210, an objective function 220, an encoder equation 230, a decoder equation 240, the encoder model 155, and the decoder model 165. The training engine 140 executes the neural network algorithm 210 that receives several inputs, including the training input sequences 171, objective function 220, encoder equation 230, and decoder equation 240 for generating outputs, including a trained and optimized encoder model 155 and a trained and optimized decoder model 165.

In some embodiments, the neural network algorithm 210 comprises a variational auto-encoder (VAE) algorithm that receives the training input sequences 171 and applies the objective function 220, encoder equation 230, and decoder equation 240 to the training input sequences 171 to train the encoder model 155 and decoder model 165. A VAE algorithm comprises an optimization algorithm that maximizes or minimizes the objective function 220 which defines the overall objective for the VAE algorithm. In general, variational auto-encoders implement an artificial neural network to learn a representation (encoding) for a set of input data for dimensionality reduction (compression) of the input data. In some embodiments, the neural network algorithm 210 comprises a VAE algorithm such as the auto-encoding variational bayes training algorithm (stochastic gradient variational bayes algorithm).

The training engine 140 executes the neural network algorithm 210 and operates in conjunction with the neural network 105 to train the encoder model 155 and decoder model 165 based on the received inputs. In particular, the training engine 140 executes the neural network algorithm 210 to perform neural network training for determining an optimized neural network parameter phi ($\phi$) for the encoder model and an optimized neural network parameter theta ($\theta$) for the decoder model that, in conjunction, best approximates the objective function 220. In some embodiments, the objective function 220 is defined by equation (1) below:

$$\max_{\theta, \phi} \mathbb{E}_{p\mathcal{D}(x_{1:T})} \left[ \mathbb{E}_{q_\phi} \left[ \log \frac{p_\theta(x_{1:T}, z_{1:T}, f)}{q_\phi(z_{1:T}, f \mid x_{1:T})} \right] \right]. \quad (1)$$

where:

$q_\phi(z_{1:T}, f|x_{1:T})$ represents the encoder model;

$p_\theta(x_{1:T}, z_{1:T}, f)$ represents the decoder model; and z0=0.

In some embodiments, in the objective function 220, the encoder model may be mathematically expressed by equation (2) below:

$$q_\phi(z_{1:T}, f \mid x_{1:T}) = q_\phi(f \mid x_{1:T}) \prod_{t=1}^{T} q_\phi(z_t \mid x_t) \quad (2)$$

In the objective function 220, the decoder model may be mathematically expressed by equation (3) below:

$$p_\theta(x_{1:T}, z_{1:T}, f) = p_\theta(f) \prod_{t=1}^{T} p_\theta(z_t \mid z_{<t}) p_\theta(x_t \mid z_t, f) \quad (3)$$

The neural network algorithm 210 comprises an optimization algorithm that maximizes the objective function 220 shown in equation (1). In particular, the neural network algorithm 210 uses neural network training to determine a neural network parameter phi ($\phi$) for the encoder model and a neural network parameter theta ($\theta$) for the decoder model that maximizes the objective function 220 shown in equation (1). Maximizing the objective function 220 shown in equation (1) also produces a minimized reconstruction error achieved by the encoder model and the decoder model when reconstructing (encoding then decoding) the training input sequences. Thus, the objective function 220 may be viewed as specifying a minimized reconstruction error to be achieved by the encoder model and the decoder model when reconstructing (encoding then decoding) the training data.

However, in actual training, reconstruction error will not be completely eliminated and some reconstruction error will exist. Thus, as used herein, "maximizing" an objective function may refer to increasing the objective function or approaching the theoretical maximum for the objective function while not necessarily reaching the theoretical maximum for the objective function. As used herein, "minimizing" the reconstruction error may refer to reducing the reconstruction error or approaching the theoretical minimum for the reconstruction error while not necessarily reaching the theoretical minimum for the reconstruction error.

In particular, to optimize the neural network parameters for the encoder model and decoder model, the neural network algorithm 210 may process each training input sequence 171 by encoding the training input sequence using the encoder model to produce a training encoded sequence and decode the training encoded sequence using decoder model to produce a training decoded sequence. The neural network algorithm 210 may then apply the objective function 220 shown in equation (1) to determine a reconstruction error comprising an error/difference between the training input sequence and the training decoded sequence, and adjust the neural network parameters for the encoder model and decoder model to attempt to produce a lower reconstruction error for a next training input sequence. The neural network algorithm 210 may process a large number training input sequences 171 in this manner to iteratively and progressively tune the neural network parameters for the encoder model and decoder model until a minimized (or reduced) reconstruction error is produced. Note that although the encoder model 155 and decoder model 165 are separate and distinct models, the encoder model 155 and decoder model 165 are trained and generated simultaneously using the same training input sequences 171 and a common object function 220.

As shown above, the common objective function 220 represented by equation (1), the encoder model represented by equation (2), and the decoder model represented by equation (3) each specify variables x, f, and z. In general, variable x is used to represent segments/frames of the training input sequences 171. For example, for a particular training input sequence x1:T of length T comprising a time-ordered sequence of frames x1 through xT, the variable x1 represents frame x1, the variable x2 represents frame x2, the variable x3 represents frame x3, . . . and the variable xT represents frame xT. The variable x that represents a particular segment/frame represents all aspects of the particular segment/frame, which includes all information/data contained in the segment/frame. For example, the variable x representing frame x1 represents all aspects of the frame x1, which includes all pixel information/values contained in frame x1. For example, the aspects of a particular frame comprises all pixel information/values contained in frame x1, such as color values (e.g., red, green, and blue values), luminance values, and/or any other pixel-related values. In other embodiments, for a sequence of audio samples, the aspects of a particular audio sample may comprise all information related to a frequency spectrum, obtained from a Fourier decomposition of the audio signal over a small time window. Thus, as used herein, an "aspect" of a segment/frame is a general term to indicate all the various types of information/values that may be contained in the segment/frame.

In general, the variable f represents static aspects of a training input sequence and a variable z represents dynamic aspects of the training input sequence. The variable f and the variable z comprise separate and distinct variables used to separately encode and decode separate and distinct aspects of each training input sequence. Thus, the encoder model and decoder model are models generated by neural networks that identify and separate (disentangle) static and dynamic aspects of the training input sequences. The variable f is used to encode/decode the static aspects of a training input sequence and the variable z is generally used to separately encode/decode the dynamic aspects of the training input sequence.

For example, for a particular training input sequence x1:T comprising frames x1 through xT, the variable f is used by the neural network and encoder/decoder models to identify and encode/decode static aspects of the sequence that are common/consistent (invariant or the same) or substantially consistent throughout/across all frames of the particular training input sequence (x1 through xT). Thus, variable f represents aspects of the sequence that are preserved over time (time-independent) throughout all frames of the particular training input sequence (x1 through xT). For a particular training input sequence, the static aspects of the sequence may be viewed as static information/data that is consistent (invariant or the same) throughout all frames of the particular sequence. Thus, static aspects of the sequence may be viewed as static information/data that is preserved over time (time-independent) throughout all frames of the particular sequence. For example, for a training input sequence comprising a frame sequence, the static aspects of the frame sequence may be viewed as static pixel information or values that are consistent (invariant or the same) throughout all frames of the particular frame sequence.

In general, the variable z represents dynamic aspects of a training input sequence comprising time-varying or time-dependent aspects. In particular, for a particular training input sequence x1:T of length T (comprising frames x1 through xT), the z1:T represents a set of ordered variables (z1 through zT) that each represent the dynamic aspects of a corresponding frame (x1 through xT) in the particular training input sequence. For example, the variable z1 may be used by the neural network and encoder/decoder models to identify and encode/decode aspects of corresponding frame x1 that are unique only to frame x1 across/throughout the entire sequence of frames x1 through xT. Variable z1 is used to encode/decode aspects of corresponding frame x1 that are unique only to frame x1 relative to all other frames in the same training input sequence. Thus, the static aspects of the training input sequence are encoded separately (into variable f) from the dynamic aspects of frame x1 (which are encoded into variable z1). For example, the variable z2 may be used by the neural network and encoder/decoder models to identify and encode/decode aspects of corresponding frame x2 that are unique only to frame x2 across/throughout the entire sequence of frames x1 through xT. Variable z2 is used to encode/decode aspects of corresponding frame x2 that are unique only to frame x2 relative to all other frames in the same training input sequence, and so forth. The neural network and encoder/decoder models specify a separate and distinct z variable for each frame in the training input sequence. Thus, the static aspects of the training input sequence are encoded separately (into variable f) from the dynamic aspects of frame x1 (which are encoded into variable z1), which are each encoded separately from the dynamic aspects of frame x2 (which are encoded into variable z2).

For a particular segment/frame in the training input sequence, the dynamic aspects of the particular segment/frame may be viewed as dynamic information/data that is unique to the particular segment/frame throughout segments/frames of the training input sequence. Thus, dynamic aspects of the particular segment/frame may be viewed as dynamic information/data that is not preserved over time (time-dependent) across/throughout the training input sequence. For example, for a training input sequence comprising a frame sequence x1 through xT, the dynamic aspects of frame x1 may be viewed as dynamic pixel information or values that are unique only to frame x1 across the entire sequence of frames x1 through xT.

Thus, the encoder model receives a training input sequence and compresses the training input sequence to generate an encoded sequence, wherein the encoder model is generated through neural network training to encode static aspects of the training input sequence that are consistent or substantially consistent throughout an entirety of the training input sequence and separately encode dynamic aspects of the training input sequence that are not consistent or substantially consistent throughout the entirety of the training input sequence. For example, for a training input sequence comprising sequence x1:T, the encoder model receives as input variables x1:T and generates as output the encoded variables f and z1:T. The decoder model receives the training encoded sequence and decompresses the training encoded sequence to generate a training decoded sequence, wherein the decoder model is generated through neural network training to decode static aspects of the training encoded sequence that are consistent through the entire training input sequence and separately decode dynamic aspects of the training encoded sequence that are not consistent through the entire training encoded sequence. For example, for the training input sequence comprising sequence x1:T, the decoder model receives as input the encoded variables f and z1:T and generates as output the variables x1:T.

By identifying and separating encoding the static and dynamic aspects of a training input sequence, the encoder model is trained to encode a single instance of the static aspects of the training input sequence for the entire of a training input sequence, rather than a separate instance for each frame in the of a training input sequence. Thus, during runtime when receiving a of a runtime input sequence, the encoder model encodes a single instance of the static aspects for the entire runtime input sequence, which increases the compression ratio and storage savings compared to the compression ratio and storage savings achieved by conventional compression techniques and/or an encoder model generated via neural network training that does not identify and encode static aspects of the input sequence.

Figure 3:
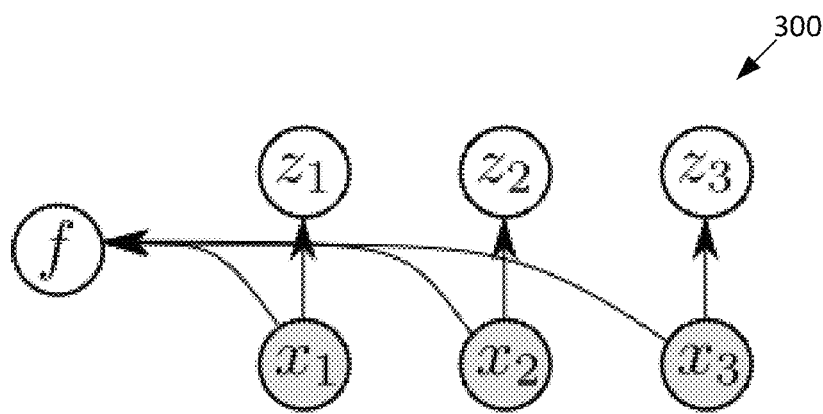
FIG. 3 is a conceptual diagram of the encoder model of FIG. 2, according to various embodiments of the present invention.

FIG. 3 is a conceptual diagram 300 of the encoder model 155 of FIG. 2, according to various embodiments of the present invention. In particular, the conceptual diagram 300 comprises a visual/graphical representation (computation graph) for the operations of the encoder model 155 as defined by equation (2) and as trained by the neural network algorithm 210. As shown, for a training input sequence comprising a set of frames x1, x2, and x3, the encoder model 155 identifies and encodes all static aspects of the training input sequence into variable f. Thus, variable f represents all static aspects of the training input sequence. Further, the encoder model 155 identifies and encodes dynamic aspects of each particular frame into a corresponding z variable. For example, the encoder model 155 identifies and encodes dynamic aspects of frame x1 into variable z1, identifies and encodes dynamic aspects of frame x2 into variable z2, and identifies and encodes dynamic aspects of frame x3 into variable z3. Thus, variable z1 represents dynamic aspects of frame x1, variable z2 represents dynamic aspects of frame x2, and variable z3 represents dynamic aspects of frame x3.

As shown in FIG. 3, a single instance of variable f (representing static aspects of the training input sequence) and a separate and distinct instance of each z-variable (z1, z2, and z3) corresponding to each frame in the training input sequence are required to represent and encode the training input sequence. As illustrated by the mapping arrows shown in FIG. 3, frame x1 is encoded into variable f and variable z1, frame x2 is encoded into variable f and variable z2, and frame x3 is encoded into variable f and variable z3. Thus, variables f and z1-z3 represent the encoding of the training input sequence and visually represent a training encoded sequence generated by the encoder model 155 for the training input sequence.

Figure 4:
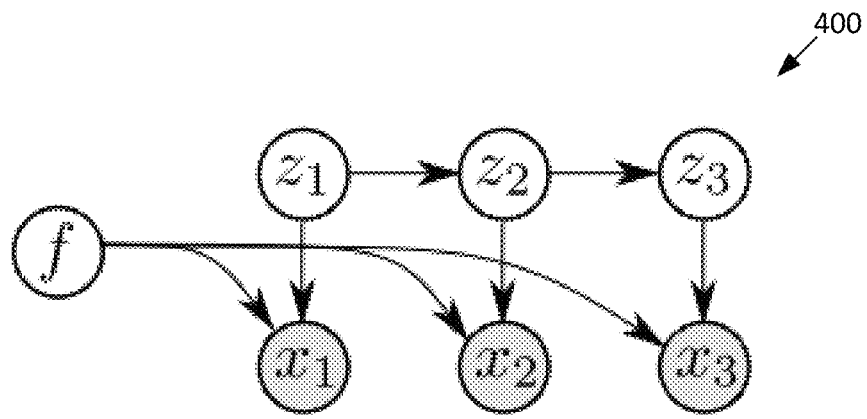
FIG. 4 is a conceptual diagram of the decoder model of FIG. 2, according to various embodiments of the present invention.

FIG. 4 is a conceptual diagram 400 of the decoder model 165 of FIG. 2, according to various embodiments of the present invention. In particular, the conceptual diagram 400 comprises a visual/graphical representation (computation graph) for the operations of the decoder model 165 as defined by equation (3) and as trained by the neural network algorithm 210. For a training encoded sequence generated for a training input sequence, the decoder model 165 decompresses the training encoded sequence to generate a training decoded sequence. In general, the decoder model 165 receives the training encoded sequence and decompresses the training encoded sequence to generate a training decoded sequence, wherein the decoder model 165 is generated through neural network training to decode static aspects of the training encoded sequence that are consistent through the entire training input sequence and separately decode dynamic aspects of the training encoded sequence that are not consistent through the entire training encoded sequence. The training encoded sequence comprises a plurality of ordered segments, such as a plurality of encoded video frames or a plurality of encoded audio samples. The decoder model 165 may be trained to decode dynamic aspects for each particular segment in the plurality of ordered segments that are unique to the particular segment through the plurality of ordered segments. For example, the decoder model 165 may be trained to decode dynamic aspects of a first segment in the plurality of ordered segments that are unique to the first segment through the plurality of ordered segments. The static aspects of the encoded sequence may be decoded separately from the dynamic aspects of the encoded sequence (such as the dynamic aspects of the first segment).

For example, as illustrated by the mapping arrows shown in FIG. 4, for a training encoded sequence generated for a training input sequence comprising frames x1, x2, and x3, the decoder model 165 decodes variable f and variable z1 to generate a decoded/reconstructed frame x1, decodes variable f and variable z2 to generate a decoded/reconstructed frame x2, and decodes variable f and variable z3 to generate a decoded/reconstructed frame x3. Thus, the reconstruction of frame xt at time t depends on variable f and corresponding variable zt.

Note that the mapping arrows between the z-variables shown in FIG. 4 are used to illustrate statistical dependencies and transitional probabilities between the various z-variables. For example, the mapping arrow between the variable z1 and variable z2 indicates that variable z2 is statistically dependent on variable z1 and requires information regarding transitional probabilities between variable z1 to variable z2 to properly reconstruct frame x2. For example, the mapping arrow between the variable z2 and variable z3 indicates that variable z3 is statistically dependent on variable z2 and requires information regarding transitional probabilities between variable z2 to variable z3 to properly reconstruct frame x2. In embodiments where the decoder model 165 is defined by equation (3), the transitional probabilities between the various z-variables is represented in equation (3) as:

$$p_\theta(z_t|z_{<t}).$$

As discussed above, the objective function 220 defines the overall objective for the neural network algorithm 210 for training the encoder and decoder models, the overall objective comprising minimizing the reconstruction error of the encoder and decoder models when encoding and decoding training input sequences. In addition, another goal of the neural network algorithm 210 for training the encoder and decoder models is to reduce, avoid, or otherwise manage "overfitting" of the encoder and decoder models to the training input sequences 171. A significant issue in machine learning and neural network training is "overfitting" where a trained model fits the training input data too well (too closely), so that during runtime the trained model cannot effectively process new input data that is different from the training input data. Overfitting may occur when the neural network parameters are tuned too much (too closely) on the training input data that the resulting model does not perform well on new input data during runtime.

In some embodiments, to prevent overfitting, the encoder and decoder models follow a probabilistic perspective by implementing probability distributions (Gaussian distributions) and probabilistic machine learning is employed to generate probabilistic models. In particular, the encoder model 155 is mathematically expressed by equation (2) which comprises a Gaussian distribution that is parameterized/optimized using neural network training, whereby the neural network parameter phi ($\phi$) is optimized using neural network training. Likewise, the decoder model 165 is mathematically expressed by equation (3) which comprises a Gaussian distribution that is parameterized/optimized using neural network training, whereby the neural network parameter theta ($\theta$) is optimized using neural network training.

The encoder and decoder models are each represented by an equation that expresses a Gaussian distribution that is determined by neural network parameters that are determined via neural network training. Thus, the encoder and decoder models each comprise a probabilistic model comprising a distribution of probabilities over the variables z and f and the training input data, respectively. In general, the neural network training is used to parameterize the means and variances of the Gaussian distributions of the encoder and decoder models. In particular, the encoder model 155 comprises an optimized Gaussian distribution over variables f and z that receives variable x as an input. A Gaussian distribution is a probability distribution over continuous probability spaces, and assigns probabilities to elements in this probability space. The fact that the probabilistic encoder model is a probability distribution over f and z means that a given sequence x is assigned to multiple possible encodings f and z, each weighted with a probability value. After this probability distribution is learned in the training phase, the encoder comprises the mappings that assign x to its most likely encoding f and z under the encoder model 155, making the encoder a deterministic mapping. The most likely value is the mean of the Gaussian distribution, which prevents the neural networks from overfitting during training. Similarly, the decoder model 165 comprises an optimized Gaussian distribution over x, whose Gaussian mean and variance are neural network transformations of f and z. After training, the Gaussian means are taken as the deterministic decoder model.

In some embodiments, in the objective function 220, the encoder model is mathematically expressed by equation (2) shown above. In alternative embodiments, in the objective function 220, the encoder model is mathematically expressed by equation (4) shown below:

$$q_\phi(z_{1:T}, f | x_{1:T}) = q_\phi(f | x_{1:T}) q_\phi(z_{1:T} | f, x_{1:T}) \quad (4)$$

Equation (2), discussed above, expresses a variational distribution used to approximate the encoder model's Bayesian posterior distribution, referred to as a "factorized q" Gaussian distribution. When the encoder model is mathematically expressed by equation (2), the encoder model comprises a "factorized q" Gaussian distribution that assumes that static aspects of the training input sequences are approximately independent of dynamic aspects of the training input sequences. Also, in the "factorized q" Gaussian distribution, for each training input sequence, the probability distribution over the static aspects is conditioned on the entire training input sequence (the variable f depends on the entire frame sequence x1:T), whereas dynamic aspects are conditioned only on the individual segments/frames of the training input sequence (each variable zt depends only on a single corresponding frame xt).

In contrast, equation (4) expresses an alternative variant of a variational distribution referred to as a "full q" Gaussian distribution. When the encoder model is mathematically expressed by equation (4), the encoder model comprises a "full q" Gaussian distribution that assumes that the variational posterior (q-function) of variables z1:T depends on variable f such that the variation distribution over variable z is parameterized by a neural network transformation of variable f. Also, in the "full q" Gaussian distribution, for each training input sequence, the probability distribution is conditioned on the entire training input sequence, whereby variables z1:T are dependent on the variable f. Thus, in the "full q" Gaussian distribution, the static aspects of a training input sequence may affect the dynamic aspects of a training input sequence when encoding the training input sequence.

Figure 5:
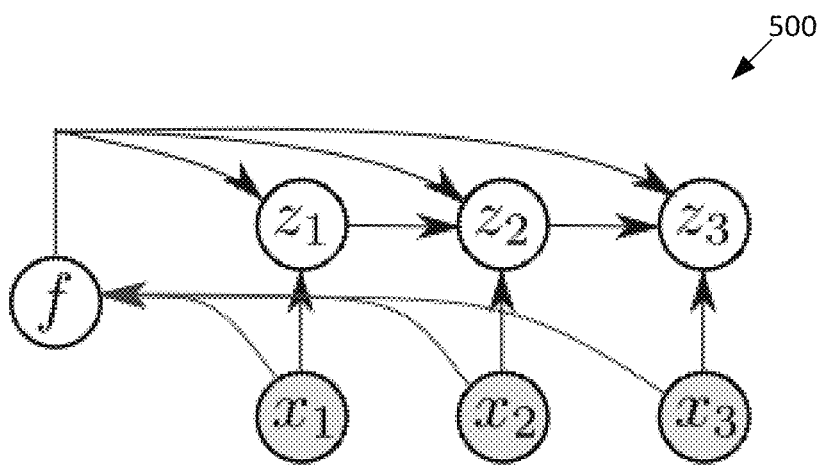
FIG. 5 is a conceptual diagram of an alternative encoder model of FIG. 2, according to various other embodiments of the present invention.

FIG. 5 is a conceptual diagram 500 of an alternative encoder model of FIG. 2, according to various other embodiments of the present invention. In particular, the conceptual diagram 500 comprises a visual/graphical representation (computation graph) for the operations of the encoder model 155 as defined by equation (4) and as trained by the neural network algorithm 210. As shown, for a training input sequence comprising a set of frames x1, x2, and x3, the alternative encoder model identifies and encodes all static aspects of the training input sequence into variable f and identifies and encodes dynamic aspects of each particular frame into a corresponding z variable. Note that variables z1:T are dependent on the variable f, whereby the static aspects f of a training input sequence may affect the dynamic aspects z1:T of a training input sequence when encoding the training input sequence.

The encoder model 155 may be implemented using equation (2) or equation (4) depending on which encoder characteristics are to be achieved. Implementing the encoder model using equation (2) may generate an encoder model that a simpler and computationally less intensive/expensive when encoding input sequences than an alternative encoder model generated using equation (4), as the encoder model does not capture correlations between variables z1:T and variable f so that fewer samples are needed. However, implementing the alternative encoder model using equation (4) may generate an alternative encoder model that more precise when encoding input sequences than the encoder model generated using equation (2), as the alternative encoder model captures correlations between variables z1:T and variable f so that more samples are needed.

Figure 6:
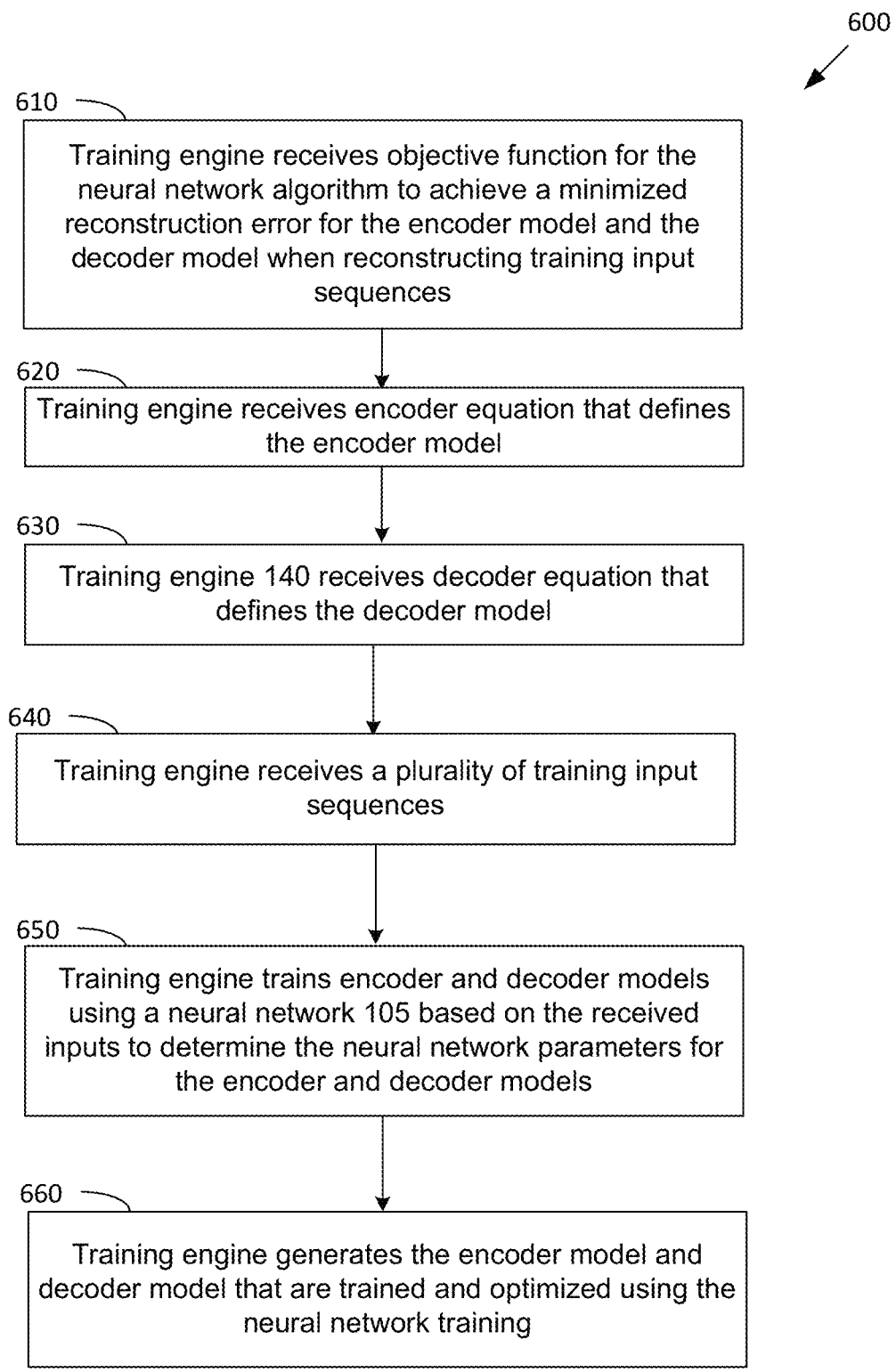
FIG. 6 illustrates a flow diagram of method steps for training and generating encoder and decoder models using a neural network, according to various embodiments of the present invention.

FIG. 6 illustrates a flow diagram of method steps for training and generating encoder and decoder models using a neural network, according to various embodiments of the present invention. Although the method steps are described in conjunction with the systems of FIGS. 1-5, persons skilled in the art will understand that the method steps can be performed in any order by any system. In some embodiments, the method 600 may be performed by a training engine 140 that executes a neural network algorithm 210 that works in conjunction with a neural network 105 to train an encoder model 155 and a decoder model 165.

The method 600 begins when the training engine 140 receives (at step 610) an objective function 220 that defines the overall objective for the neural network algorithm 210. In some embodiments, goal of the objective function 220 is to achieve a minimized reconstruction error by the encoder model and the decoder model when reconstructing (encoding then decoding) training input sequences. The training engine 140 also receives (at step 620) an encoder equation that mathematically expresses the encoder model 155 to be used in the objective function 220. In some embodiments, the encoder equation comprises equation (2) that expresses a "factorized q" Gaussian distribution. In other embodiments, the encoder equation comprises equation (4) that expresses a "full q" Gaussian distribution. The training engine 140 further receives (at step 630) a decoder equation that mathematically expresses the decoder model 165 to be used in the objective function 220. In some embodiments, the decoder equation comprises equation (3). In some embodiments, the objective function 220, encoder equation/model, and decoder equation/model each define a first variable f representing static aspects of training input data and a second variable z generally representing dynamic aspects of the training input data. The first variable f and the second variable z comprise separate and distinct variables used to encode and decode separate and distinct aspects of the training input data.

The training engine 140 then receives (at step 640) training input data comprising a plurality of training input sequences, each training input sequence comprising an ordered sequence of segments, each segment comprising a discrete set of data associated with a particular order number in the ordered sequence. For example, the training input data may comprise a plurality of frame sequences (video clips) or a plurality of audio sequences (audio clips). The training engine 140 then trains (at step 650) the encoder model 155 and decoder model 165 using a neural network 105 based on the received inputs (the objective function 220, encoder equation, decoder equation, and training input sequences). In particular, the training engine 140 executes the neural network algorithm 210 to perform neural network training for determining an optimized neural network parameter phi ($\phi$) for the encoder model and an optimized neural network parameter theta ($\theta$) for the decoder model that, in conjunction, best approximates the objective function 220. The training engine 140 then generates (at step 660) the encoder model 155 and decoder model 165 that have been trained and optimized using a neural network training in step 650. The encoder model 155 may then be implemented by an encoder engine 155 and the decoder model 165 implemented by a decoder engine 165 during runtime. The method 600 then ends.

Section III: Runtime Phase

During the training phase, the encoder model 155 and decoder engine 165 are trained to encode and decode input sequences while achieving a high compression rate and low reconstruction error (high reconstruction quality) for a wide range of runtime input sequences. During runtime, the encoder model 155 will produce a high compression rate relative to conventional approaches as the encoder model 155 is generated using neural network training using a wide range and large number of different training input sequences. Thus, encoder model 155 has been trained to compress a wide range of different input sequences with high compression rates. Further, the encoder model 155 is trained to separate the static and dynamic aspects of the input sequences which produces high compression rates as only one instance of the static aspects of each input sequence is generated and stored for each input sequence. Also, during runtime, the encoder model 155 and decoder engine 165 will work in conjunction to reconstruct (encode and decode) input sequences having a lower reconstruction error than achieved in conventional approaches, as the encoder model 155 and decoder engine 165 are generated using neural network training using a wide range and large number of different training input sequences. Thus, encoder model 155 and decoder engine 165 have been trained to reconstruct a wide range of different input sequences with low reconstruction error. Further, the encoder model 155 is trained to separate the static and dynamic aspects of the input sequences which produces high compression rates as only one instance of the static aspects of each input sequence is generated and stored for each input sequence.

Figure 7:
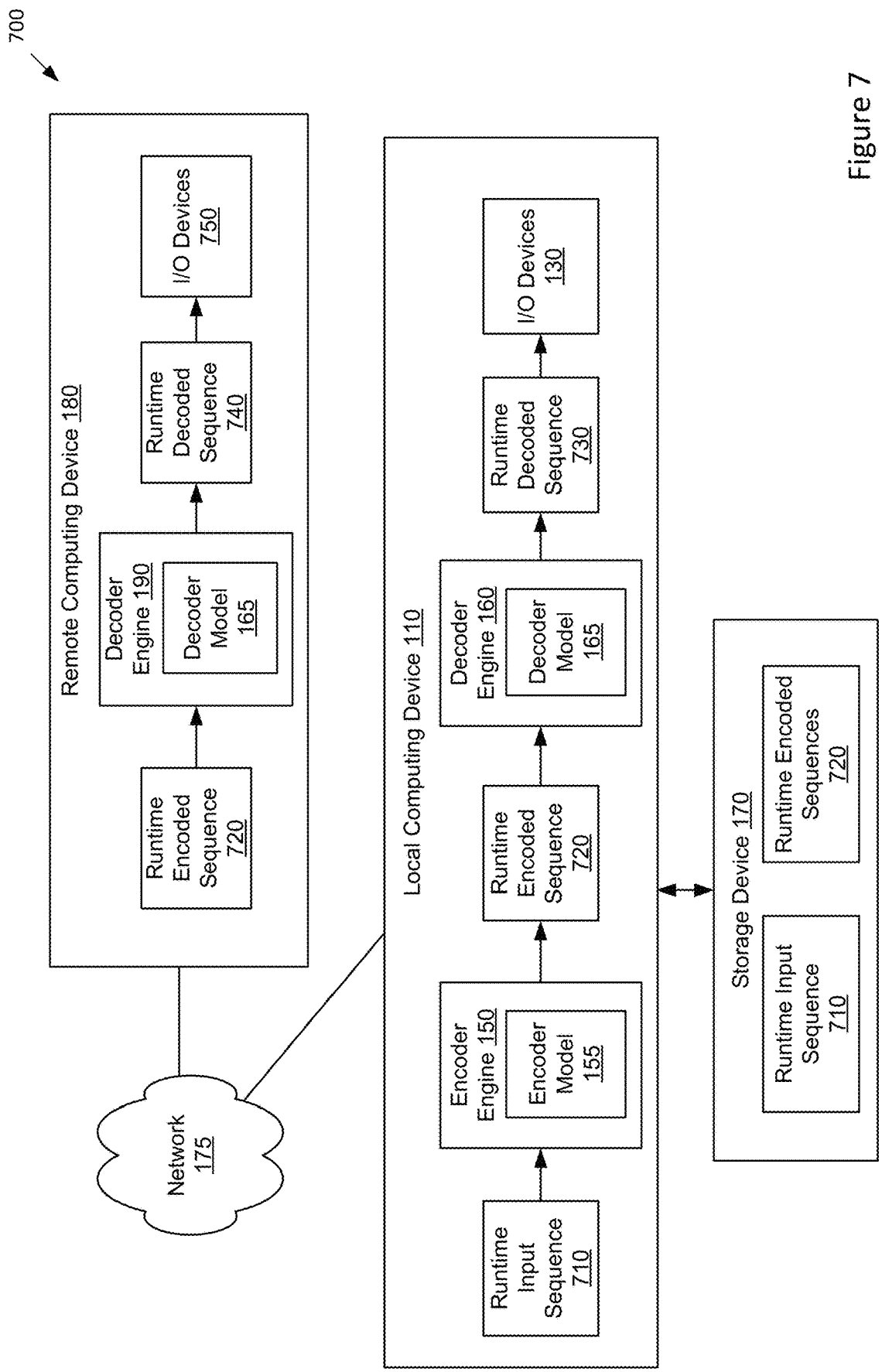
FIG. 7 illustrates a runtime system that is implemented in the computer environment of FIG. 1, according to various embodiments of the present invention.

FIG. 7 illustrates a runtime system 700 that is implemented in the computer environment 100 of FIG. 1, according to various embodiments of the present invention. The runtime system 700 may comprise an environment for encoding and decoding runtime input sequences using encoder and decoder models that are trained and optimized using a neural network. As shown, the system 700 includes, without limitation, a local computing device 110, and a remote computing device 180 that are coupled together via a network 175. The local computing device 110 is coupled to a storage device 170 that stores a particular runtime input sequence 710 to be encoded and decoded by the runtime system 700.

As shown, the local computing device 110 includes an encoder engine 155 that implements the encoder model 155 and a decoder engine 165 that implements the decoder model 165. Once trained by the neural network, during runtime the encoder model 155 and decoder model 165 will also separate (disentangle) the static and dynamic aspects of runtime input sequences. During runtime, optimized encoder model 155 and decoder model 165 perform deterministic mappings between the runtime input sequences (input data x1:T) and code (the representations of the runtime input sequences encoded into variables f and z1:T).

The encoder engine 155 receives the runtime input sequence 710 and compresses/encodes the runtime input sequence 710 implementing the encoder model 155 to generate a runtime encoded sequence 720. Similar to operations of the encoder model 155 in the training phase described above, the encoder model 155 will identify and separate (disentangle) static and dynamic aspects of the runtime input sequence 710 when encoding the runtime input sequence 710. In particular, for a runtime input sequence 710 comprising segments/frames x1:T, the encoder model 155 will encode the static aspects of the runtime input sequence 710 into variable f and the dynamic aspects of the runtime input sequence 710 into variables z1:T. Thus, the encoder model 155 can be viewed as performing a deterministic mapping from the runtime input sequence 710 (data x1:T) to code (encoded variables f and z1:T). When encoding, the encoder model 155 produces separate encoded data for each of the variables f and z1:T which are each separately stored. For example, for a runtime input sequence 710 comprising frames x1, x2, and x3, the encoder model 155 produces separate encoded data for each of variables f, z1, z2, and z3, which are each separately stored. Note that only one instance of the encoded data for variable f is generated and stored for the entire runtime input sequence 710.

The runtime encoded sequence 720 may be stored to the storage device 170 until playback for the runtime encoded sequence 720 is requested by a user. The runtime encoded sequence 720 will have a significantly reduced data size in comparison to the uncompressed runtime input sequence 710. Thus, storing the runtime encoded sequence 720 to the storage device 170 will enable significant storage savings compared to storing the runtime input sequence 710, which may now be deleted from the storage device 170. When storing the runtime encoded sequence 720 to the storage device 170, the runtime encoded sequence 720 may be stored as a data file.

If the runtime encoded sequence 720 is to be played back at the local computing device 110 (e.g., in response to a user request), the runtime encoded sequence 720 may be retrieved from the storage device 170 (e.g., as a data file). The decoder engine 165 receives the runtime encoded sequence 720 and decompresses/decodes the runtime encoded sequence 720 implementing the decoder model 165 to generate a runtime decoded sequence 730. Similar to operations of the decoder model 165 in the training phase described above, the decoder model 165 will identify and separate (disentangle) static and dynamic aspects of the runtime encoded sequence 720 when decoding the runtime encoded sequence 720. In particular, for a runtime input sequence 710 comprising segments/frames x1:T, the decoder model 165 decodes the static aspects of the runtime input sequence 710 encoded into variable f and decodes the dynamic aspects of the runtime input sequence 710 encoded into variables z1:T to reconstruct each of the segments/frames of the runtime input sequence 710, which comprises the runtime decoded sequence 730. Thus, the decoder model 165 can be viewed as performing a deterministic mapping from the code (encoded variables f and z1:T) to the runtime input sequence 710 (data x1:T). The runtime decoded sequence 730 may then be played back/presented via I/O devices 130, such as a display monitor and/or audio speaker, at the local computing device 110.

If the runtime encoded sequence 720 is to be played back at the remote computing device 180 (e.g., in response to a user request), the runtime encoded sequence 720 may be retrieved from the storage device 170 (e.g., as a data file) and transmitted to the remote computing device 180 via the network 175. Note that the runtime encoded sequence 720 requires a lower bit rate, lower bandwidth requirements, and/or lower transmission time compared to transmitting the runtime input sequence 710 via the network 175. At the remote computing device 180, the decoder engine 190 then receives the runtime encoded sequence 720 and decompresses/decodes the runtime encoded sequence 720 implementing the decoder model 165 to generate a runtime decoded sequence 740. The runtime decoded sequence 740 may then be played back/presented via I/O devices 750, such as a display monitor and/or audio speaker, at the remote computing device 180.

Figure 8:
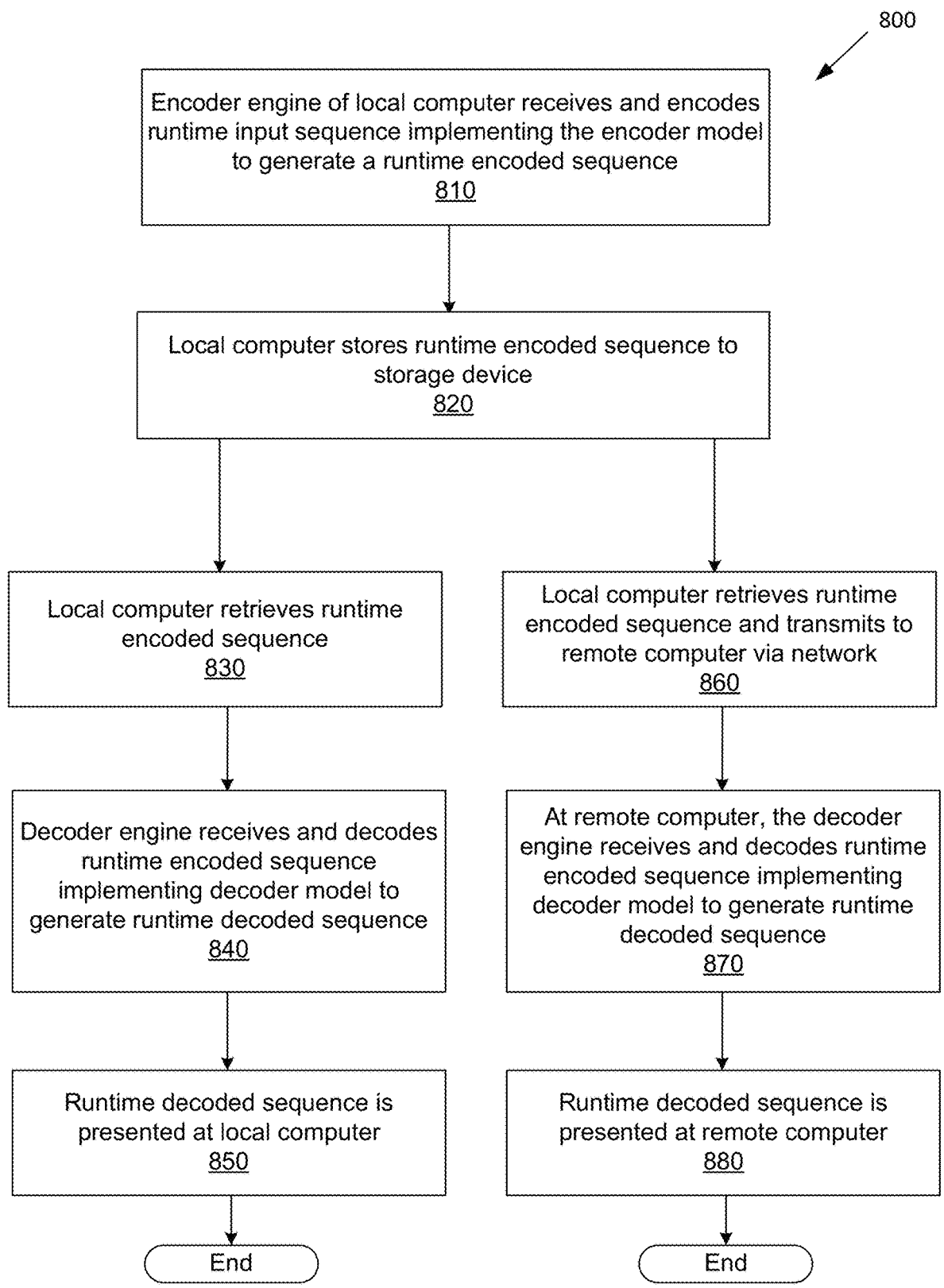
FIG. 8 illustrates a flow diagram of method steps for encoding and decoding a runtime input sequence, according to various embodiments of the present invention.

FIG. 8 illustrates a flow diagram of method steps for encoding and decoding a runtime input sequence, according to various embodiments of the present invention. Although the method steps are described in conjunction with the systems of FIGS. 1-5 and 7 persons skilled in the art will understand that the method steps can be performed in any order by any system.

The method 800 begins when an encoder engine 155 of a local computing device 110 receives and compresses/encodes (at step 810) the runtime input sequence 710 implementing the encoder model 155 to generate a runtime encoded sequence 720. The local computing device 110 then stores (at step 820) the runtime encoded sequence 720 to the local storage device 170 (e.g., as a data file) until playback for the runtime encoded sequence 720 is requested by a user.

If the runtime encoded sequence 720 is to be played back at the local computing device 110 (e.g., in response to a user request), the local computing device 110 retrieves (at step 830) the runtime encoded sequence 720 (e.g., as a data file) from the storage device 170. The decoder engine 165 receives and decompresses/decodes (at step 840) the runtime encoded sequence 720 implementing the decoder model 165 to generate a runtime decoded sequence 730. The runtime decoded sequence 730 is then played back/presented (at step 850) via I/O devices 130, such as a display monitor and/or audio speaker, at the local computing device 110. The method 800 then ends.

If the runtime encoded sequence 720 is to be played back at the remote computing device 180 (e.g., in response to a user request), the runtime encoded sequence 720 may be retrieved from the storage device 170 and transmitted (at step 860) to the remote computing device 180 via the network 175. At the remote computing device 180, the decoder engine 190 then receives and decompresses/decodes (at step 870) the runtime encoded sequence 720 implementing the decoder model 165 to generate a runtime decoded sequence 740. The runtime decoded sequence 740 may then be played back/presented (at step 880) via I/O devices 750, such as a display monitor and/or audio speaker, at the remote computing device 180. The method 800 then ends.

In sum, embodiments described herein include apply neural network technologies to encoding/decoding technologies to further develop encoding/decoding techniques. In particular, embodiments described herein include compression techniques for encoding/decoding data sequences using an encoder model and a decoder model that are each generated and trained using a neural network.

During the training phase, neural network training is used to generate an encoder model and a decoder model that, in conjunction, approximates a common objective function using a plurality of training input sequences. Each training input sequence comprises an ordered sequence of segments/frames. In particular, neural network training is used to determine/tune an optimized neural network parameter phi ($\phi$) for the encoder model and an optimized neural network parameter theta ($\theta$) for the decoder model that, in conjunction, best approximates the common objective function. In some embodiments, the common objective function may specify a minimized reconstruction error to be achieved by the encoder model and the decoder model when reconstructing (encoding then decoding) the training input sequences.

In further embodiments, the common objective function specifies, for both the encoder model and the decoder model, a variable f representing static aspects of the training input data and a set of variables z1:T representing dynamic aspects of the training input sequences. The variable f and the set of variables z1:T comprise separate and distinct variables used to encode and decode separate and distinct aspects of the training input sequences. In particular, for training input data comprising a particular time-ordered sequence of frames x1:T of length T (i.e., frames x1 . . . xT), the variable f is used by the neural network and encoder/decoder models to identify and encode/decode static aspects of the sequence that are common/consistent through all frames of the sequence (x1 . . . xT). The variables z1:T comprises a set of ordered variables of length T (z1 . . . z T) that each represent the dynamic aspects of a corresponding frame in the sequence of frames x1:T. For example, the variable z1 may be used by the neural network and encoder/decoder models to identify and encode/decode aspects of corresponding frame x1 that are unique to frame x1 across the entire sequence of frames x1:T.

During runtime, the trained and optimized encoder model may be implemented in an encoder machine that receives and encodes/compresses a runtime input sequence to produce an encoded sequence. The trained and optimized decoder model may be implemented in a decoder machine that receives and decodes/decompresses the encoded sequence to produce a decompressed sequence. The decompressed sequence comprises the reconstructed sequence of the runtime input sequence.

At least one technological improvement of the disclosed techniques relative to prior art is that implementing an encoder model generated via neural network training to compress an input sequence can provide higher compression ratios than achieved by conventional compression techniques. In particular, the disclosed techniques leverage the machine learning ability of neural networks to approximate any function, such as encoder and decoder functions, to train an encoder model to achieve higher compression ratios compared to conventional compression techniques.

At least one other technological improvement of the disclosed techniques relative to prior art is that compressing an input sequence by implementing an encoder model generated via neural network training for identifying and encoding at least one static aspect of the input sequence can provide a further increase in compression ratios than achieved by conventional compression techniques and/or an encoder model generated via neural network training that does not identify and encode static aspects of the input sequence. In particular, implementing an encoder model generated via neural network training that identifies a static aspect of the input sequence allows a single instance of the static aspect to be encoded for the entire input sequence, which allows for higher compression ratios than achieved by an encoder model that does not identify and encode/decode static aspects of the input sequence.

At least one other technological improvement of the disclosed techniques relative to prior art is that implementing an encoder model and decoder model each generated via neural network training to reconstruct (encode and decode) an input sequence can provide higher compression ratios and/or higher reconstruction quality than achieved by conventional compression techniques. In particular, the disclosed techniques leverage the machine learning ability of neural networks to approximate any function, such as encoder and decoder functions, to train an encoder model and decoder to achieve higher compression ratios and/or higher reconstruction quality (lower reconstruction error) compared to conventional compression techniques.

At least one other technological improvement of the disclosed techniques relative to prior art is that reconstructing (encoding and decoding) an input sequence an input sequence by implementing an encoder model and decoder model each generated via neural network training for identifying and encoding/decoding at least one static aspect of the input sequence can provide a further increase in compression ratios and reconstruction quality than achieved by conventional compression techniques and/or an encoder model and decoder model generated via neural network training that does not identify and encode/decode static aspects of the input sequence. In particular, implementing an encoder model and a decoder model each generated via neural network training that identifies a static aspect of the input sequence allows a single instance of the static aspect to be encoded and decoded for the entire input sequence, which allows for even higher compression ratios and higher reconstruction quality than achieved by an encoder model and a decoder model that does not identify and encode/decode static aspects of the input sequence.

Aspects of the subject matter described herein are set out in the following numbered any of clauses.

1. In some embodiments, a computer-implemented method for encoding an input sequence, the method comprising: receiving the input sequence at an encoder engine; and encoding the input sequence via an encoder model implemented by the encoder engine to generate an encoded sequence, wherein the encoder model is trained through a neural network to encode static aspects of the input sequence that are substantially consistent throughout an entirety of the input sequence.

2. The computer-implemented method of clause 1, wherein the input sequence comprises a plurality of ordered segments.

3. The computer-implemented method of any of clauses 1-2, wherein the static aspects of the input sequence comprise aspects of the plurality of ordered segments that are substantially consistent throughout the plurality of ordered segments.

4. The computer-implemented method of any of clauses 1-3, wherein the encoder model is further trained to encode dynamic aspects of a first segment included in the plurality of ordered segments that are unique to the first segment.

5. The computer-implemented method of any of clauses 1-4, wherein the static aspects of the input sequence are encoded separately from the dynamic aspects of the first segment.

6. The computer-implemented method of any of clauses 1-5, wherein the encoder model is further trained to encode dynamic aspects for each particular segment included in the plurality of ordered segments that are unique to the particular segment.

7. The computer-implemented method of any of clauses 1-6, further comprising determining a neural network parameter for the encoder model is through neural network training that achieves an objective function.

8. The computer-implemented method of any of clauses 1-7, wherein the encoder model is trained based on an encoder equation that specifies separate variables for encoding static aspects and dynamic aspects of training data input into the neural network.

9. The computer-implemented method of any of clauses 1-8, further comprising: transmitting the encoded sequence to a remote computer via a network; decoding the encoded sequence at the remote computer via a decoder model trained through a neural network to generate a decoded sequence.

10. In some embodiments, a non-transitory computer-readable medium storing program instructions that, when executed by a processor, cause the processor to encode an input sequence by performing the steps of: receiving the input sequence at an encoder engine; and encoding the input sequence via an encoder model implemented by the encoder engine to generate an encoded sequence, wherein the encoder model is trained through a neural network to encode static aspects of the input sequence that are substantially consistent throughout an entirety of the input sequence.

11. The non-transitory computer-readable medium of clause 10, wherein the input sequence comprises a plurality of ordered segments.

12. The non-transitory computer-readable medium of any of clauses 10-11, wherein the input sequence comprises a plurality of video frames.

13. The non-transitory computer-readable medium of any of clauses 10-12, wherein the input sequence comprises a plurality of audio samples.

14. The non-transitory computer-readable medium of any of clauses 10-13, wherein the encoder model is generated through neural network training to encode dynamic aspects of a first segment included in the plurality of ordered segments that are unique to the first segment.

15. The non-transitory computer-readable medium of any of clauses 10-14, wherein the static aspects of the input sequence are encoded separately from the dynamic aspects of the first segment.

16. The non-transitory computer-readable medium of any of clauses 10-15, wherein the encoder model is trained based on an encoder equation that expresses a Gaussian distribution.

17. The non-transitory computer-readable medium of any of clauses 10-16, wherein the encoder model is trained based on an encoder equation that specifies separate variables for encoding static aspects and dynamic aspects of training data input into the neural network.

18. The non-transitory computer-readable medium of any of clauses 10-17, further comprising: storing the encoded sequence to a storage device; retrieving the encoded sequence from the storage device; and decoding the encoded sequence at the remote computer via a decoder model trained through a neural network to generate a decoded sequence.

19. In some embodiments, a computing system configured for encoding an input sequence, comprising: a memory that includes an encoder engine; and a processor that is coupled to the memory and, upon executing the encoder engine, performs the steps of: receiving the input sequence; and encoding the input sequence via an encoder model implemented by the encoder engine to generate an encoded sequence, wherein the encoder model is trained through a neural network to encode static aspects of the input sequence that are substantially consistent throughout an entirety of the input sequence.

20. The computing system of clause 19, wherein the input sequence comprises a plurality of ordered segments.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for encoding an input sequence, the method comprising:
   receiving the input sequence at an encoder engine; and
   encoding the input sequence via an encoder model implemented by the encoder engine to generate an encoded sequence, wherein the encoder model is trained through a neural network to encode static aspects of the input sequence that are substantially consistent throughout an entirety of the input sequence.

2. The computer-implemented method of claim 1, wherein the input sequence comprises a plurality of ordered segments.

3. The computer-implemented method of claim 2, wherein the static aspects of the input sequence comprise aspects of the plurality of ordered segments that are substantially consistent throughout the plurality of ordered segments.

4. The computer-implemented method of claim 2, wherein the encoder model is further trained to encode dynamic aspects of a first segment included in the plurality of ordered segments that are unique to the first segment.

5. The computer-implemented method of claim 4, wherein the static aspects of the input sequence are encoded separately from the dynamic aspects of the first segment.

6. The computer-implemented method of claim 2, wherein the encoder model is further trained to encode dynamic aspects for each particular segment included in the plurality of ordered segments that are unique to the particular segment.

7. The computer-implemented method of claim 1, further comprising determining a neural network parameter for the encoder model through neural network training that achieves an objective function.

8. The computer-implemented method of claim 1, wherein the encoder model is trained based on an encoder equation that specifies separate variables for encoding static aspects and dynamic aspects of training data input into the neural network.

9. The computer-implemented method of claim 1, further comprising:
   transmitting the encoded sequence to a remote computer via a network;
   decoding the encoded sequence at the remote computer via a decoder model trained through a neural network to generate a decoded sequence.

10. A non-transitory computer-readable medium storing program instructions that, when executed by a processor, cause the processor to encode an input sequence by performing the steps of:
   receiving the input sequence at an encoder engine; and
   encoding the input sequence via an encoder model implemented by the encoder engine to generate an encoded sequence, wherein the encoder model is trained through a neural network to encode static aspects of the input sequence that are substantially consistent throughout an entirety of the input sequence.

11. The non-transitory computer-readable medium of claim 10, wherein the input sequence comprises a plurality of ordered segments.

12. The non-transitory computer-readable medium of claim 10, wherein the input sequence comprises a plurality of video frames.

13. The non-transitory computer-readable medium of claim 10, wherein the input sequence comprises a plurality of audio samples.

14. The non-transitory computer-readable medium of claim 11, wherein the encoder model is generated through neural network training to encode dynamic aspects of a first segment included in the plurality of ordered segments that are unique to the first segment.

15. The non-transitory computer-readable medium of claim 14, wherein the static aspects of the input sequence are encoded separately from the dynamic aspects of the first segment.

16. The non-transitory computer-readable medium of claim 10, wherein the encoder model is trained based on an encoder equation that expresses a Gaussian distribution.

17. The non-transitory computer-readable medium of claim 10, wherein the encoder model is trained based on an encoder equation that specifies separate variables for encoding static aspects and dynamic aspects of training data input into the neural network.

18. The non-transitory computer-readable medium of claim 10, further comprising:
   storing the encoded sequence to a storage device;
   retrieving the encoded sequence from the storage device; and
   decoding the encoded sequence at the remote computer via a decoder model trained through a neural network to generate a decoded sequence.

19. A computing system configured for encoding an input sequence, comprising:
   a memory that includes an encoder engine; and
   a processor that is coupled to the memory and, upon executing the encoder engine, performs the steps of:
      receiving the input sequence; and
      encoding the input sequence via an encoder model implemented by the encoder engine to generate an encoded sequence, wherein the encoder model is trained through a neural network to encode static aspects of the input sequence that are substantially consistent throughout an entirety of the input sequence.

20. The computing system of claim 19, wherein the input sequence comprises a plurality of ordered segments.

* * * * *